United States Patent
Um

[11] Patent Number: 5,159,225
[45] Date of Patent: Oct. 27, 1992

[54] PIEZOELECTRIC ACTUATOR

[75] Inventor: Gregory Um, Torrance, Calif.

[73] Assignee: Aura Systems, Inc., El Segundo, Calif.

[21] Appl. No.: 779,346

[22] Filed: Oct. 18, 1991

[51] Int. Cl.$^5$ .................... H01L 41/04; H01L 41/09
[52] U.S. Cl. .................................. 310/328; 310/333; 310/366
[58] Field of Search ................ 310/331, 333, 328, 366

[56] References Cited

U.S. PATENT DOCUMENTS

| | | | |
|---|---|---|---|
| 3,507,984 | 4/1970 | Stavis | 178/5.4 |
| 3,510,571 | 5/1970 | Biedermann | 178/5.4 |
| 3,748,504 | 7/1973 | Guntersdorfer et al. | 310/331 |
| 3,760,096 | 9/1973 | Roth | 178/5.4 |
| 4,441,791 | 4/1984 | Hornbeck | 350/360 |
| 4,553,061 | 11/1985 | Germano | 310/332 |
| 4,566,935 | 1/1986 | Hornbeck | 156/626 |
| 4,571,603 | 2/1986 | Hornbeck et al. | 346/160 |
| 4,615,595 | 10/1986 | Hornbeck | 353/122 |
| 4,633,118 | 12/1986 | Kosugi | 310/328 |
| 4,638,309 | 1/1987 | Ott | 340/783 |
| 4,680,579 | 7/1987 | Ott | 340/783 |
| 4,705,361 | 11/1987 | Frazier et al. | 350/355 |
| 4,710,732 | 12/1987 | Hornbeck | 332/7.51 |
| 4,736,132 | 4/1988 | Culp | 310/333 |
| 4,856,863 | 8/1989 | Sampsell et al. | 350/96.16 |
| 4,859,012 | 8/1989 | Cohn | 350/96.24 |
| 4,933,592 | 6/1990 | Priddy | 310/332 |
| 4,944,580 | 7/1990 | MacDonald | 310/328 |
| 4,956,619 | 9/1990 | Hornbeck | 330/4.3 |
| 5,028,939 | 7/1991 | Hornbeck et al. | 346/160 |

OTHER PUBLICATIONS

Television—A New Schlieren Light Valve For Television Projection, by Van Raalte, Applied Optics, vol. 9, No. 10, Oct. 1970, pp. 2225-2230.

The Mirror-Matrix Tube: A Novel Light Valve For Projection Display, by Thomas et al., IEEE Transactions on Electron Devices, vol. ED-22, No. 9, Sep. 1975, pp. 765-775.

Dynamic Micromechanics On Silicon: Techniques And Devices, by Petersen, IEEE Transactions on Electron Devices, vol. ED-25, No. 10, Oct. 1978, pp. 1241-1250.

TV Projection Display Using An Amorphous-SE-Type Ruticon Light Valve, by Lakatos et al., IEEE Transactions on Electron Devices, vol. ED-24, No. 7, Jul. 1977, pp. 930-934.

Micromechanical Light Modulator Array Fabricated On Silicon, by Petersen, Applied Physics Letters, vol. 31, No. 8, Oct. 15, 1977, pp. 521-523.

Primary Examiner—William H. Beha, Jr.
Assistant Examiner—C. LaBalle
Attorney, Agent, or Firm—Anthony T. Cascio; Lisa A. Clifford

[57] ABSTRACT

A piezoelectric actuator includes a pair of piezoelectric members which are oriented to shear laterally toward each other in the presence of an applied voltage. A hinge having translational members (which act similarly to a rack) and a rotating member (which acts similarly to a pinion) is attached to the top of the piezoelectric members with one translational attached to a respective one of the piezoelectric members. A driven member attached radially outward from the rotating member will then move through an arc when the piezoelectric members laterally shear. An object, such as a mirror, when carried by the distal end of the driven member, will then be actuated.

8 Claims, 1 Drawing Sheet

PIEZOELECTRIC ACTUATOR

RELATED APPLICATION DATA

The present application is related to the following commonly owned, co-pending applications: Ser. No. 07/429,987, Ser. No. 07/448,748, now U.S. Pat. No. 5,126,836, Ser. No. 07/494,579, now U.S. Pat. No. 5,085,497, and Ser. No. 07/504,125, now U.S. Pat. No. 5,138,309, heretofore filed, and to Ser. No. 07/779,345, and Ser. No. 07/779,540, filed concurrently herewith, each of which is incorporated herein by reference.

FIELD OF THE INVENTION

The present invention relates generally to electromechanical acutators and more particularly to such actuators wherein piezoelectric devices convert electrical energy to mechanical actuation.

BACKGROUND OF THE INVENTION

Actuated mirror arrays are useful for one component in the modulation of light intensity wherein the beam reflected from each mirror is modulated by the flux of such beam passing through a slit aperture, as disclosed in Ser. No. 07/429,987, and Ser. No. 07/448,748. As described therein, the flux is controlled by the orientation of the mirror relative to the aperture. A piezoelectric actuator has been disclosed for actuating each mirror in response to an electrical signal applied to each actuator. The electrical signal is commensurate with the degree of modulation desired. The control circuitry for the actuators has been described in Ser. No. 07/504,125. Several examples of piezoelectric actuators and mirror arrays constructed therefrom are disclosed in Ser. No. 07/494,579.

SUMMARY OF THE INVENTION

It is an object of the present invention to provide yet another actuator for such mirror arrays.

According to the present invention, a piezoelectric actuator includes a pair of piezoelectric members which are oriented to shear laterally toward each other in the presence of an applied voltage. A hinge having translational members (which act similarly to a rack) and a rotating member (which acts similarly to a pinion) is attached to the top of the piezoelectric members with one translational attached to a respective one of the piezoelectric members. A driven member attached radially outward from the rotating member will then move through an arc when the piezoelectric members laterally shear. An object, such as a mirror, when carried by the distal end of the driven member, will then be actuated.

These and other objects, advantages and features of the present invention will become readily apparent to those skilled in the art from a study of the following Description of an Exemplary Preferred Embodiment when read in conjunction with the attached Drawing and appended Claims.

DESCRIPTION OF AN EXEMPLARY PREFERRED EMBODIMENT

Figure 1:
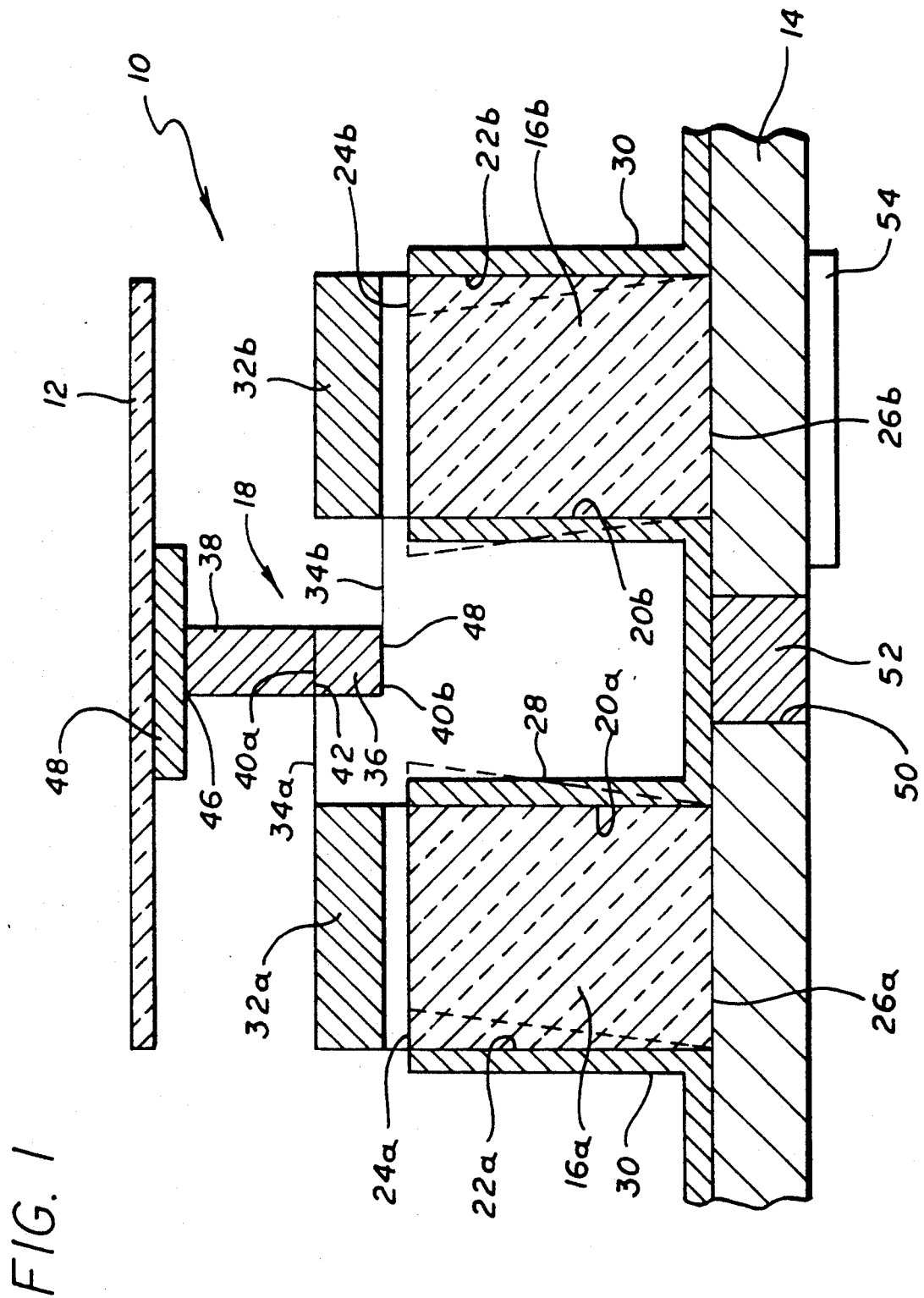
FIG. 1 is a cross sectional view of an acutator constructed according to the principles of the present invention.

Referring now to the Drawing, there is shown a mirror actuator 10 for imparting a tilting motion relative to the plane of a mirror 12. The actuator 10 includes a substrate 14, a pair of piezoelectric members 16a, 16b and a hinge 18.

Each of the piezoelectric members 16a, 16b has a first side surface 20a, 20b, a second side surface 22a, 22b, a top surface 24a, 24b and a bottom surface 26a, 26b. The bottom surface 26a, 26b is mounted to the substrate 14. To perform the mounting, and each mounting described hereinbelow, an epoxy may be used. In the preferred embodiment, the first side surface 20a, 20b of each of the piezoelectric members are in a facing relationship to each other, and the second side surface 22a, 22b is opposite therefrom.

The polarization of the piezoelectric members 16a, 16b is selected so that when a voltage is applied between their respective first side surface 20a,20b and a second side surface 22a,22b each member 16a, 16b will shear in a direction determined by the polarity of the voltage. By placing the first side surface 20a, 20b of each member 16a, 16b in a facing relationship, the application of the identical voltage will cause the top surface 24a, 24b of each member 16a, 16b to shear toward each other for a first polarity or shear away from each other for a second, opposite polarity of the applied voltage. Of course, other orientations and polarizations of the piezoelectric members 16a, 16b when combined with the proper voltage and polarity applied to each member 16a, 16b are possible and are within the scope of the present invention. For example, the members 16a, 16b may be oriented with the first side surface 20a of the first member 16a facing the second side surface 20b of the second member 16b. The applied voltage to each member 16a, 16b would then have opposite polarity at each to achieve the same result. Alternatively, the piezoelectric members could be considered to have opposite polarity of the shear mode and, when arranged front to back, would require the same polarity at each member to shear as described above.

To apply such voltage, a first metalization 28 is deposited, by conventional techniques, to interconnect the first side surface 20a, 20b of each member 16a, 16b. Similarly, a second metalization 30 is applied to each second side surface 22a, 22b. The second metalization may be coupled to a common, ground potential. Application of the voltage to the first metalization 28 will therefore cause each piezoelectric member 16a,16b to shear.

The hinge 18 includes a pair of mounting members 32a, 32b, a pair of translational members 34a, 34b, a rotating member 36 and a driven member 38. Each of the mounting members 32 are mounted to the top surface 24a, 24b of a respective one of the piezoelectric members 16a, 16b. The rotating member 36 is disposed between each mounting member 32a, 32b and attached thereto by each translational members 34a, 34b. More particularly, the first translational member 34a is mounted at its distal end 40a to an upper portion 42 of the rotating member 36 and the second translational member 34b is mounted at its distal end 40b to a lower portion 44 of the rotating member 36. The driven member 38 is attached to the rotating member 36 and extends radially outward from the axis of rotation.

A distal end 46 of the driven member may include a planar platform 48 to which the mirror 12 is mounted. As best seen in FIGS. 3-4, the application of a voltage will cause shearing as described hereinabove to tilt the plane of the mirror 12 in response to the rotation of the rotating member 36.

The hinge 18 as described hereinabove may be fabricated unitarily by micromachining a suitable material selected to provide for flexibility of the translational members 34a, 34b and to allow rotation of the rotating member 36. The material is further selected to be rigid enough so that the driven member 38 can support the weight of an object mounted thereto. Numerous plastic or metal composites are suitable. Alternatively, the hinge 18 may be constructed from parts and assembled as hereinabove described.

An array of such actuators 10 may be constructed to be individually addressable. An opening 50 is formed through the substrate 14 intermediate each pair of piezoelectric members 16a,16b in the array of such pairs. A metalization 52 fill the hole and is in electrical contact with the first metalization 28. An addressable driver 54 mounted to the lower surface of the substrate 14, such as disclosed in Ser. No. 07/504,125, applies a voltage to each metalization 52. The voltage at each pair in the array may be developed in accordance with pixel intensity in a light modulator projection apparatus of the type disclosed in Ser. No. 07/429,987, or Ser. No. 07/448,748. The second metalization 30 at each second face 24a, 24b may be interconnected in common on the top surface of the substrate.

There has been described hereinabove a novel piezoelectric actuator which finds particular usefulness in a mirror array. Those skilled in the art may now make numerous uses of and departures from the above described embodiments without departing from the inventive concepts disclosed herein. Accordingly, the present invention is to be defined solely by the scope of the following claims.

I claim:

1. An apparatus for tilting the plane of an object comprising:
    a substrate;
    a pair of spaced apart piezoelectric members, each of said members having a top surface, a bottom surface, a first side surface and a second side surface, said bottom surface being mounted to said substrate, said members further having a polarization selected so that a voltage applied between said first side surface and said second side surface thereof causes said top surface to laterally shear in a direction determined by the polarity of said applied voltage, said first side surface of each of said members being in a facing relationship so that said applied voltage at each of said members causes said top surface of each of said members to shear toward each other when said voltage has a first polarity and to shear away from each other when said voltage has a second polarity opposite said first polarity; and
    a hinge having a pair of mounting members, a pair of translational members, a rotating member, and a driven member, each of said mounting members being mounted to said top surface of a respective one of said piezoelectric members, said rotating member being disposed between said mounting members and attached thereto by said translational members wherein a first one of said translational members extends from a first one of said mounting members to an upper portion of said rotating member and a second one of said translational members extends from a second one of said mounting members to a lower portion of said rotating member, said driven member being attached to said rotating member and extended radially outward from an axis of rotation thereof, said driven member further including a platform to which said object is mounted, whereby shearing of said piezoelectric members imparts a tilting motion to said object when carried by a distal end of said driven member.

2. An apparatus as set forth in claim 1 wherein said platform is substantially planar.

3. An apparatus as set forth in claim 2 wherein said platform is normal to the radius of said axis of rotation.

4. An apparatus as set forth in claim 1 wherein said first side surface has a first metalization applied thereto and said second side surface has a second metalization applied thereto.

5. An actuated mirror array for tilting the plane of mirror in such array comprising:
    a substrate having a plurality of openings therethrough;
    a plurality of pairs of spaced apart piezoelectric members, each of said pairs being disposed proximate a respective one of said openings, each of said members having a top surface, a bottom surface, a first side surface and a second side surface, said bottom surface being mounted to said substrate, said members further having a polarization selected so that a voltage applied between said first side surface and said second side surface thereof causes said top surface to laterally shear in a direction determined by the polarity of said applied voltage, said first side surface of each of said members of each of said pairs being in a facing relationship so that said applied voltage at each of said members of said pairs causes said top surface of each of said members in each of said pairs to shear toward each other when said voltage has a first polarity and to shear away from each other when said voltage has a second polarity opposite said first polarity, said first side surface of each of said members in each of said pairs being addressable through one of said openings proximate thereto, said second side surface of all of said members being electrically coupled in common;
    a plurality of hinges associated with each of said pairs, each of said hinges having a pair of mounting members, a pair of translational members, a rotating member, and a driven member, each of said mounting members being mounted to said top surface of a respective one of said piezoelectric members, said rotating member being disposed between said mounting members and attached thereto by said translational members wherein a first one of said translational members extends from a first one of said mounting members to an upper portion of said rotating member and a second one of said translational members extends form a second one of said mounting members to a lower portion of said rotating member, said driven member being attached to said rotating member and extended radially outward from an axis of rotation thereof, whereby shearing of said piezoelectric members in each pair imparts a tilting motion to each mirror when carried by a distal end of said driven member.

6. An apparatus as set forth in claim 5 wherein said driven member has a planar platform to which one mirror is mounted.

7. An apparatus as set forth in claim 6 wherein said platform is normal to the radius of said axis of rotation.

8. An apparatus as set forth in claim 5 wherein said first side surface of each of said members for each of said pairs has a first metalization applied thereto and one of said openings proximate thereto has a metal therein in electrical contact with said first metalization so that each of said pairs may be addresses, and further wherein said second side surface of all of said members has a second metalization applied thereto and connected in common on the top surface of said substrate.

* * * * *